United States Patent
Ruckerbauer

(10) Patent No.: US 6,896,534 B2
(45) Date of Patent: May 24, 2005

(54) ZERO INSERTION FORCE MOUNT FOR FIXING AND MAKING CONTACT WITH CIRCUIT SUBASSEMBLIES ON A SUBSTRATE

(75) Inventor: Hermann Ruckerbauer, Moos (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/610,184

(22) Filed: Jun. 30, 2003

(65) Prior Publication Data
US 2004/0038575 A1 Feb. 26, 2004

(30) Foreign Application Priority Data
Jun. 28, 2002 (DE) .......................... 102 29 117

(51) Int. Cl.[7] .............................................. H01R 13/15
(52) U.S. Cl. ...................... 439/259; 439/260; 439/631; 439/267
(58) Field of Search ................... 439/259, 260, 439/261, 266, 267, 631

(56) References Cited

U.S. PATENT DOCUMENTS

| | | | | |
|---|---|---|---|---|
| 3,444,503 A | * | 5/1969 | Mallery ...................... | 439/267 |
| 3,992,653 A | * | 11/1976 | Richardson et al. ........ | 439/260 |
| 4,211,458 A | | 7/1980 | Kent | |
| 5,735,709 A | * | 4/1998 | Hashiguchi et al. ........ | 439/260 |
| 5,813,876 A | * | 9/1998 | Rutigliano ................... | 439/260 |
| 5,995,378 A | * | 11/1999 | Farnworth et al. .......... | 439/260 |
| 6,045,381 A | | 4/2000 | Walkup et al. | |
| 6,184,698 B1 | * | 2/2001 | Yoshida et al. ............. | 439/259 |
| 6,371,781 B1 | | 4/2002 | Jones et al. | |

FOREIGN PATENT DOCUMENTS

| | | |
|---|---|---|
| DE | 94 02 628.9 U1 | 6/1994 |
| DE | 199 31 337 A1 | 1/2000 |
| EP | 1 067 632 A1 | 1/2001 |

* cited by examiner

Primary Examiner—Tho D. Ta
(74) Attorney, Agent, or Firm—Laurence A. Greenberg; Werner H. Stemer; Ralph E. Locher

(57) ABSTRACT

A zero insertion force mount for fixing and making contact with circuit subassemblies on a substrate has a plurality of holding devices for holding the circuit subassemblies and a zero insertion force device (ZIF mechanism), in a stressed state of the zero insertion force device. The circuit subassemblies are disposed in the holding devices being fixed by a pressing force exerted via the contact elements.

19 Claims, 4 Drawing Sheets

ZERO INSERTION FORCE MOUNT FOR FIXING AND MAKING CONTACT WITH CIRCUIT SUBASSEMBLIES ON A SUBSTRATE

BACKGROUND OF THE INVENTION

Field of the Invention

The invention relates to a zero insertion force mount for fixing and making contact with circuit subassemblies on a substrate having a plurality of contact elements and a zero insertion force device.

In modular electronic systems with a variable configuration, a system circuit board with one or with a plurality of installation spaces (slots) is usually provided. The slots are respectively populated with a modular component, depending on the requirements on the system or on the level of expansion of the system, or remain unpopulated.

A typical example of such a modular system is a computer system (PC, workstation, server) with a working memory that can be expanded. Slots for memory modules are provided on the system circuit board in the form of insertion mounts and are populated with memory modules, depending on the desired size of the working memory.

Normal memory modules such as SIMMs (single in-line memory modules) and DIMMs (dual in-line memory modules) have contact surfaces disposed along a contact edge of the memory module, on one side or both sides, in order to make electrical contact. When the memory module is installed in the slot, the memory module is inserted with the contact edge into the insertion mount (edge connector). For this purpose, the insertion mount has, on inner sides of a holding device formed as a groove, contact elements that correspond to the contact surfaces of the memory modules and that, during population, are deformed and exert a spring force resulting from the deformation on a memory module inserted in the holding device.

The number of contact elements per insertion mount is 168 for memory configurations with SDRAM components (synchronous dynamic random access memory), 184 for memory configurations with DDRI components (double data rate I DRAM), and about 240 for those with DDRII components (double data rate II DRAM). In general, for faster concepts of memory configurations, an increasing number of contact elements is to be expected in the insertion mounts.

With each contact element, the expenditure of force needed for fixing and removing the memory modules increases. The stressing of the system circuit board when fitting the memory modules rises and, to the same extent, so does the probability of damage to sensitive structures on the system circuit board or to the contact elements of the insertion mount. Thus, normal insertion mounts for memory modules are nowadays specified for only about twenty-five (25) insertion cycles.

However, the contact force exerted by each contact element may not be reduced significantly because, as the contact force decreases, the reliability of making contact is reduced.

In particular for testing semiconductor devices, use is made of test sockets with ZIF mechanisms (Zero Insertion Force mechanisms), with which population of the test socket that in particular looks after the contact elements of the test socket is possible.

Such a test socket is illustrated schematically in cross section in FIG. 2. The test socket 11 is disposed on a substrate surface 30 of a substrate 3 and has a zero insertion force device 9. A semiconductor device 21' is provided on a carrier 22 that has contact-making devices 13'. Each contact-making device 13' is assigned a contact recess 14 in the test socket 11. The recess is bounded on one side by a section of a contact-making device 13.

The zero insertion force device 9 includes a lever arm 91 that can be rotated about an axis of rotation 94, a slide 95 that can move parallel to a substrate surface 30, and a conversion device 93. The conversion device 93 converts a rotation of the lever arm 91 into a displacement of the slide 95. The slide has a limiting element 12 for each contact recess 14.

In an unpopulated state of the test socket 11, in this case the limiting elements 12 are located on the side of the contact recesses 14 respectively located opposite the contact-making devices 13.

When the carrier 22 is fed into the test socket 11, the contact-making devices 13' of the carrier 22 in the contact recesses 14 are in each case disposed between one of the contact-making devices 13 of the test socket 11 and one of the limiting elements 12 of the slide 95. As a result of rotation of the lever arm 91 in the counterclockwise direction, the slide 95 is moved to the left. In the process, the contact-making devices 13' of the carrier 22 are clamped in between one of the contact-making devices 13 and one of the limiting elements 12 in each case. The carrier 22 is therefore connected mechanically and electrically to the substrate 3.

However, a test socket like the one illustrated in FIG. 2, however cannot make contact with DIMMs with rows of contact surfaces located on both sides, along a contact edge of the memory module. In this case, contact elements would have to be provided in the contact recesses of the test socket of FIG. 2 for both sides of the contact edge and connected to the substrate by fixed contact-making devices. However, the slide 95 would then no longer be movable.

A zero insertion force mount of a different kind for memory modules is disclosed by Jones et al. in U.S. Pat. No. 6,371,781. In this case, before the actual fitting of the memory modules to the slot, mechanical adapters having snap-in connectors are fixed to the memory modules: for example, by being screwed or riveted. When fitted at the slot, the snap-in connectors latch into prepared matching pieces of the zero insertion force mount. The snap-in connectors then press the contact elements onto the memory module in the fitted state. In this case, the insertion force needed for fitting is reduced by the wedge-shaped configuration of the snap-in connectors.

The disadvantage with such a zero insertion force mount is in particular the high expenditure and the high space requirement. The high space requirement is disadvantageous in particular in a configuration of a plurality of such insertion mounts beside one another because, with the distance of the slots from one another, propagation time differences of signals fed into memory modules provided in the insertion mounts also increase. It is precisely for future, fast systems that such zero insertion force mounts can be used only conditionally.

SUMMARY OF THE INVENTION

It is accordingly an object of the invention to provide a zero insertion force mount for fixing and making contact with circuit subassemblies on a substrate that overcomes the hereinafore-mentioned disadvantages of the heretofore-known devices of this general type.

With the foregoing and other objects in view, there is provided, in accordance with the invention, a zero insertion force mount for fixing and making contact with circuit subassemblies having contact surfaces disposed on two mutually opposite surfaces in which the circuit subassemblies can be disposed close beside one another and no mechanical changes must be made on the latter in order to fit the mount with circuit subassemblies.

Therefore, the zero insertion force mount according to the invention has a zero insertion force device and a plurality of holding devices disposed beside one another and parallel to one another to be populated with circuit subassemblies. Mechanical components needed for a zero insertion force device can, at least to some extent, be assigned to more than one single holding device. The space requirement per holding device is therefore reduced. Together with the configuration of the holding device in a common insulating body (connector block), as compared with known solutions, the result is a very low space requirement of the zero insertion force device per holding device (slot). Circuit subassemblies held in the holding devices can be placed very close beside one another. Propagation time differences of signals fed into the circuit subassemblies are minimized.

The zero insertion force device, in a stressed state, fixes the circuit subassemblies held in or on the holding devices (5) by a pressing force exerted via the contact elements. In a released state, the pressing force exerted by the contact elements is at least reduced by the zero insertion force device.

Furthermore, in the released state of the zero insertion force device, the circuit subassemblies can be fed into the holding devices or removed without significant expenditure of force. In the process, the probability that damage will occur during the feeding or removal of the circuit subassemblies is advantageously reduced. In addition, the contact elements are not subjected to any wear as a result of insertion cycles.

In a preferred embodiment of the zero insertion force mount according to the invention, the zero insertion force device is actuated by using a lever arm. In a first position of the lever arm, the zero insertion force mount is in a released state, in which the circuit subassemblies are removed or fed in. In a second position of the lever arm, the zero insertion force mount is in the stressed state, in which the circuit subassemblies are fixed and contact is made with them.

Rotation of the lever arm about an axis of rotation during the transition between the two positions is converted by a conversion device into a displacement of reinforcements of the zero insertion force device.

Fixing the lever arm in the second position, corresponding to the stressed state, is required in order to make reliable contact and is preferably carried out by a spring force.

According to a preferred embodiment of the zero insertion force mount according to the invention, the spring force is exerted by the conversion device. The conversion device is then formed approximately as a body of elliptical cross section, which, at least to some extent, is formed from a resilient material, for example an elastomer, and is disposed along the axis of rotation of the lever arm. In this case, the body preferably extends over a length that corresponds approximately to a longitudinal extent of the holding devices.

The contact elements of a holding device in each case are disposed in a front row of contacts and a rear row of contacts. If the holding devices are in each case formed as a groove or slot in an insulating body, then the two rows of contacts are in each case disposed opposite one another, directly or with an offset, on inner sides of the groove or the slot, running along the holding device.

The contact elements of each row are connected to one another in a mechanically rigid manner. Furthermore, via the reinforcements of the zero insertion force mount, in each case all the front and/or all the rear rows of contacts are connected to one another in a mechanically rigid manner.

According to the zero insertion force mount according to the invention, in each case a plurality of, but preferably all the rows of contacts of at least one type, can be deformed and/or displaced jointly by the zero insertion force device.

Preferably, only the contact elements in each case of one type of a row of contacts can be deformed and/or displaced jointly by the reinforcement. The contact elements of the rows of contacts of the respective other type are fixed. The zero insertion force mount according to the invention in this case preferably has spring elements that exert a force on the fixed contact elements in the direction of the deformable and/or displaceable contact elements, and in this way support the reliable making of contact with a circuit subassembly held in the holding device.

The spring elements are preferably formed from a resilient material. In a particularly preferred embodiment of the zero insertion force mount according to the invention, the spring elements of a row of contacts in each case form a unit and are formed as a common spring element.

The common spring element is then preferably formed as a body of elliptical cross section in each case extending at least over the entire length of the rows of contacts and formed of a resilient material, for example an elastomer. The common spring element is preferably disposed at the level of a contact region of the contact elements, on a mounting side facing away from the contact region. In this case, the contact region of a contact element is the region in which the contact element makes contact with the contact surfaces of a circuit device disposed in the holding device.

The zero insertion force mount preferably has a solid insulating body, in which the holding devices are in each case formed as a groove or slot. The insulating body reinforces the zero insertion force mount and fixes the contact elements in an electrically insulating way. The slots permit simple adjustment of the circuit subassemblies relative to the contact elements and mechanically stabilize the circuit subassemblies disposed in the slots.

All the contact elements can have contact-making devices. The individual contact elements can be electrically conductively connected to signal lines disposed on or in the substrate by the contact-making devices. In a particularly preferred way, however, contact connections are provided in the zero insertion force mount according to the invention, and in each case electrically connect to one another mutually corresponding contact elements of different rows of contacts switching the same bus signal to the circuit subassemblies. As a result, the number and action of reflection points acting on the bus signals and formed by the contact elements and contact-making devices 8, and a parasitic capacitance or parasitic effects of the zero insertion force mount can be reduced.

On each holding device, further devices known to those skilled in the art have to be provided as required for supporting the fitting operation and for fixing the circuit subassemblies in the holding devices. Such devices are, for example, additional guide aids, coding devices against wrong fitting, ejection mechanisms, and locks.

Other features that are considered as characteristic for the invention are set forth in the appended claims.

Although the invention is illustrated and described herein as embodied in a zero insertion force mount for fixing and making contact with circuit subassemblies on a substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
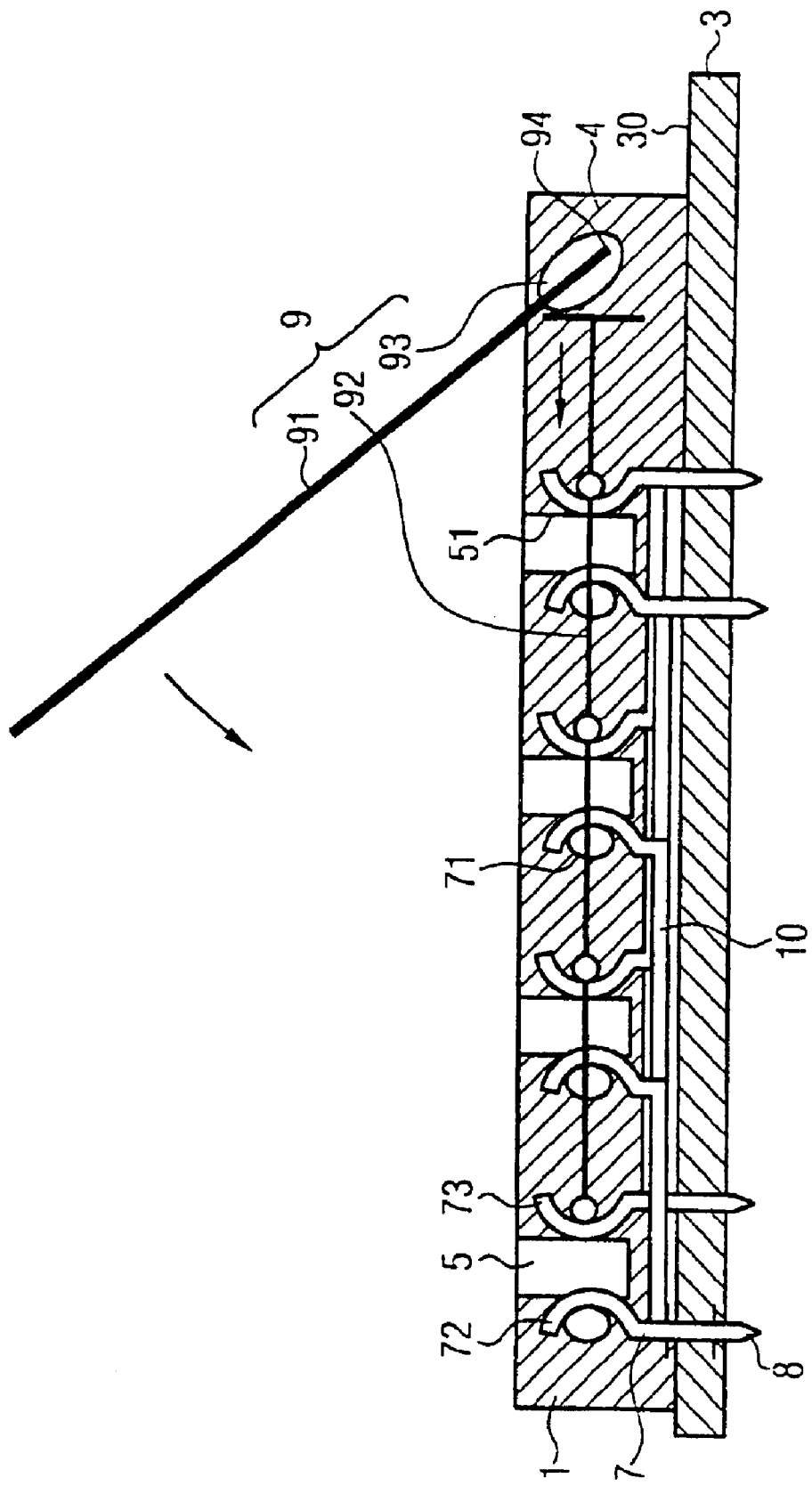
FIG. 1A is a diagrammatic sectional view showing a first embodiment of a configuration having a zero insertion force mount according to the invention in a released state.
Figure 1B:
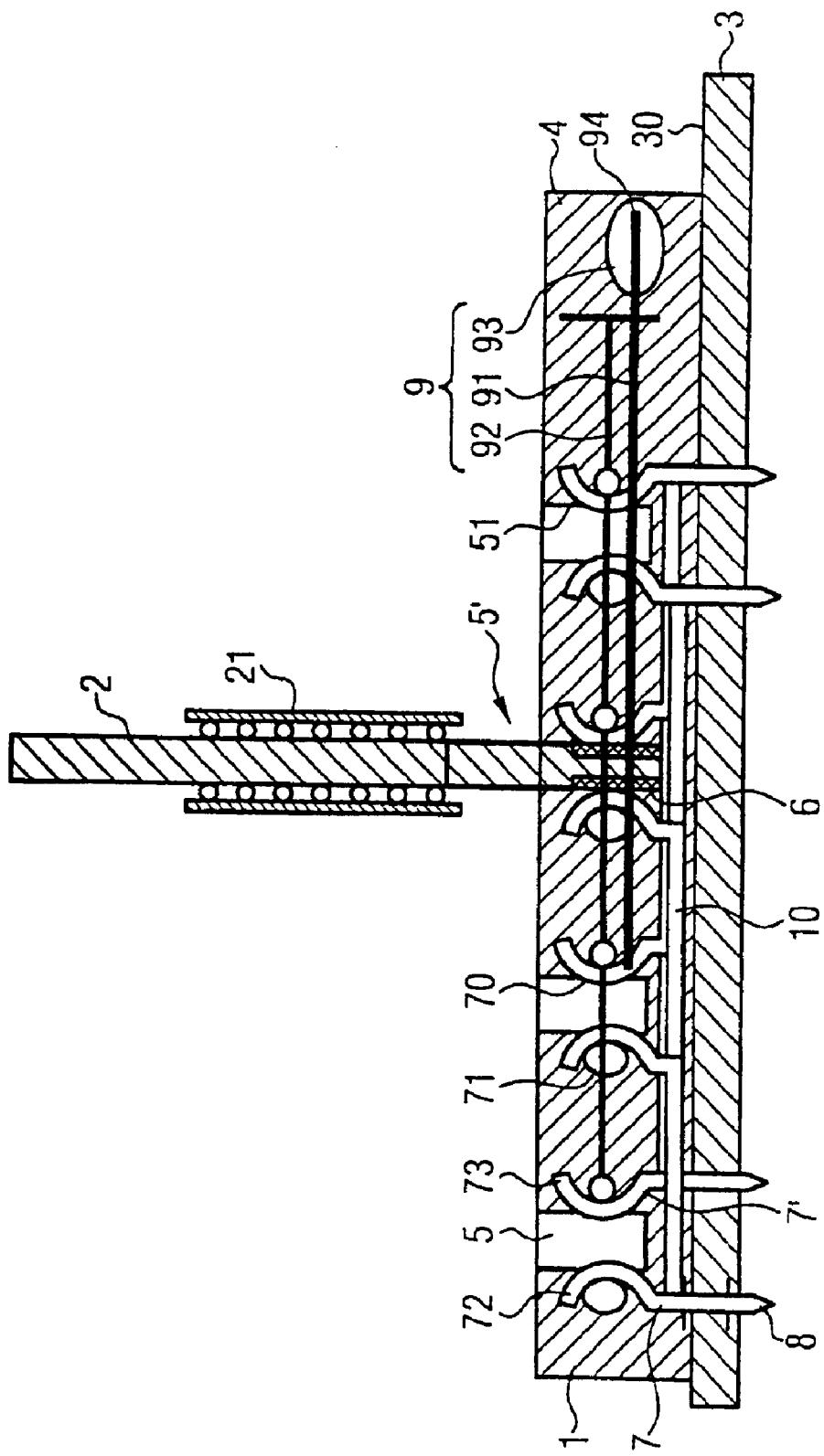
FIG. 1B is a diagrammatic sectional view showing the first embodiment of the configuration having a zero insertion force mount according to the invention in the stressed state.
Figure 2:
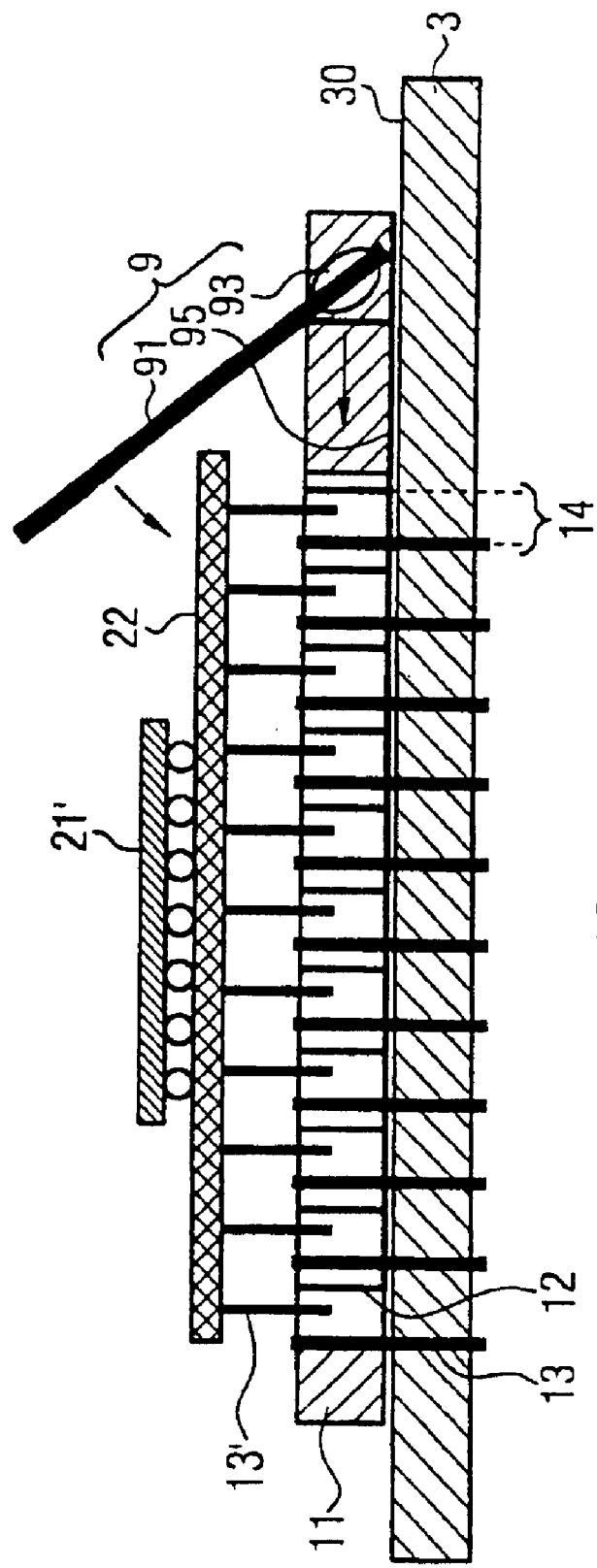
FIG. 2 is a diagrammatic sectional view showing a configuration with a test socket according to the prior art.

Referring now to the figures of the drawings in detail and first, particularly to FIGS. 1A and 1B thereof, there is shown a zero insertion force mount 1. The zero insertion force mount 1 is in this case disposed on a substrate surface 30 of a substrate 3. A plurality of holding devices 5 is disposed in an insulating body 4 of the zero insertion force mount 1 beside one another and parallel to one another. In each case, the holding devices are formed as a slot in the insulating body 4.

Provided on inner sides 51 of the holding devices 5, located opposite one another, directly or with an offset, are front rows of contacts 72 and rear rows of contacts 73 of contact elements 7, 7'. In each case corresponding contact elements 7, 7' of different rows of the same type are electrically conductively connected to one another via contact connections 10. The contact elements 7 of the front rows of contacts 72 are fixed in the insulating body 4. Spring elements 71 act on the contact elements 7 of the front rows of contacts 72. The spring elements 71 exert a force in the direction of the opposite rear rows of contacts 73. The contact elements 7' of the rear rows 73 are connected to one another in a mechanically rigid manner.

A number of the contact elements 7 have contact-making devices 8 for electrical connection to signal lines located on or in the substrate 3.

The zero insertion force device 9 includes a lever arm 91 that can be rotated about an axis of rotation 94, a reinforcement 92 that can move parallel to a substrate surface 30, and a conversion device 93. The conversion device 93 transforms a rotation of the lever arm 91 into a displacement of the reinforcement 92 parallel to the substrate surface 30. The reinforcement connects the rear rows of contacts 73 in a mechanically rigid manner.

In FIG. 1A, the zero insertion force mount is illustrated in a released state. The lever arm 91 is in a first position. The spring elements 71 are relieved of stress, as is the conversion device 93. The spacing of contact regions 70 between two contact elements 7 located opposite one another, directly or with an offset, is maximal.

In this state, the circuit subassemblies 2 can be inserted into the slots of the holding devices 5 without an opposing force exerted by the contact elements 7 having to be overcome in the process.

Following the insertion of the circuit subassemblies 2 into the slots of the holding device 5, the lever arm 91 is moved in the counterclockwise direction, until it is aligned substantially parallel to the substrate surface 30. Because of the elliptical cross section of the conversion device 94, the reinforcement 92 is displaced to the left in the process. The contact elements 7 of the rear row of contacts 73, connected to the reinforcement 92 in a mechanically rigid manner, are forced in the direction of the front rows of contacts 72 in the contact region. The spacing of contact regions 70 between two contact elements 7 located opposite one another, directly or with an offset, is reduced.

If a circuit subassembly 2 is disposed in a holding device 5' in this case, then, in a stressed state, which is illustrated in FIG. 1b, said circuit subassembly 2 is in each case fixed between the front row of contacts 72 and the rear row of contacts 73, the spring elements 71 and the conversion device 93 exerting a contact force, needed for making contact, on the contact elements 7. Furthermore, FIG. 1B reveals that, in the stressed state shown of the zero insertion force mount 1, the lever arm 91 is aligned substantially parallel to the substrate surface 30.

Figure 3:
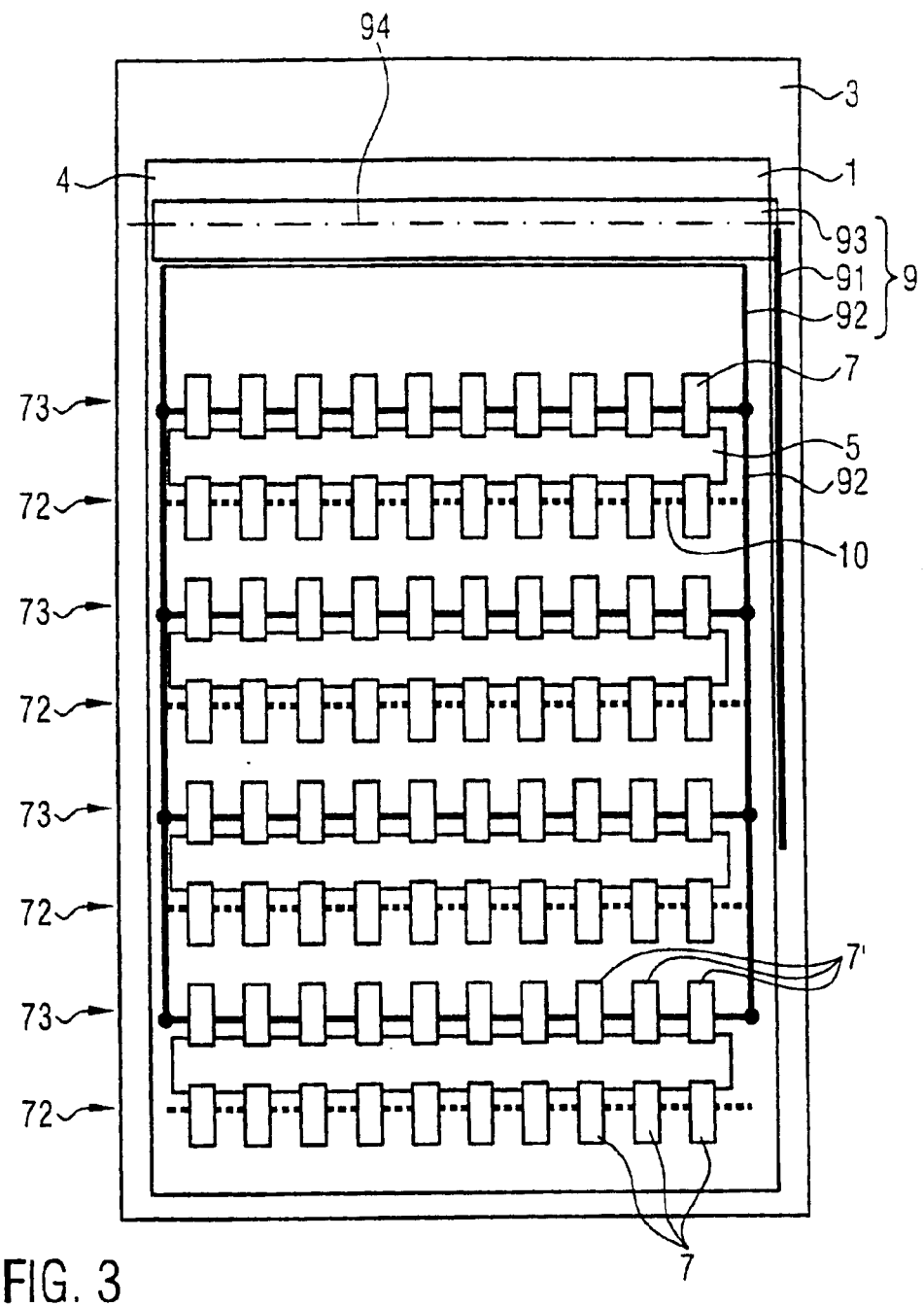
FIG. 3 is a diagrammatic plan view of the first embodiment of the configuration having a zero insertion force mount according to the invention in the released state.

In FIG. 3, the zero insertion force mount illustrated in FIGS. 1A and 1B is shown in a plan view. At the same time, the configuration of the contact elements 7, 7' in relation to one another is additionally revealed by FIG. 3. In this case, the contact elements 7, 7' in each case lie directly opposite rows of contacts 72, 73 assigned to a holding device 5 in this example. However, if required, it is also possible to dispose the contact elements 7, 7' to be located opposite one another with an offset.

Furthermore, FIG. 3 reveals that the conversion device 93 is disposed along the axis of rotation 94 and has a longitudinal extent which corresponds substantially to a longitudinal extent of the holding devices S.

Figure 4:
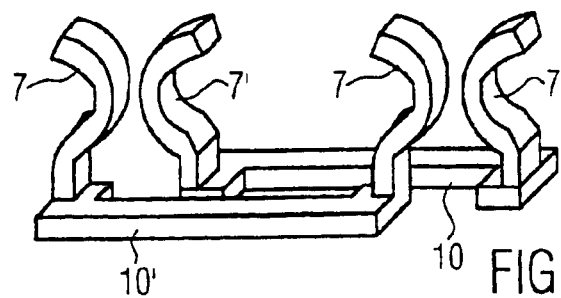
FIG. 4 shows a perspective illustration of a configuration including two contact elements and a contact connection provided between the contact elements according to the exemplary embodiment of the zero insertion force mount according to the invention.

FIG. 4 shows two pairs 7, 7 and 7', 7' of contact elements 7, 7' in each case connected by contact connections 10. In this case, the contact elements 7, 7' respectively assigned to a common holding device 5 are located opposite one another with an offset.

I claim:

1. A zero insertion force mount for fixing and making contact between circuit subassemblies and a substrate, comprising:

a plurality of holding devices, each of said holding devices being adapted to hold a respective one of the circuit subassemblies;

a plurality of contact elements in each of said holding devices, said contact elements of each of said holding devices being disposed in a front row of contacts and in a rear row of contacts opposing said front row of contacts, said contact elements of each of said rows of contacts being connected to one another in a mechanically rigid manner, and said contact elements of at least one of said rows of contacts in each case being jointly moveable, at least in sections;

a zero insertion force device operating said contact element to lock the circuit subassemblies in said holding devices.

2. The zero insertion force mount according to claim 1, wherein said at least one of said rows of contacts is deformable.

3. The zero insertion force mount according to claim 1, wherein said at least one of said rows of contacts is displaceable.

4. The zero insertion force mount according to claim 1, further comprising an insulating body;

said insulating body having said holding devices formed therein as a groove for holding the circuit subassemblies.

5. The zero insertion force mount according to claim 1, further comprising a plurality of contact connections electrically connecting corresponding contact elements of a plurality of said rows of said contacts to one another.

6. The zero insertion force mount according to claim 1, wherein said zero insertion force device is operable between a stressed state and a released state, said zero insertion farce device in said stressed state fixing the circuit subassemblies disposed against said holding devices with a pressing force exerted via said contact elements, and said zero insertion force device in said released state exerting at least a reduced force by said contact elements on the circuit subassemblies.

7. The zero insertion force mount according to claim 6, wherein, in said released state of said zero insertion force device, the circuit subassemblies are feedable into and removable from said holding devices without any force acting counter to a pressing force exerted on said contact elements.

8. The zero insertion force mount according to claim 6, wherein said zero insertion force device includes a lever arm, said lever arm having a first and a second position and setting said zero insertion force device into said stressed state when changed from said first position to said second position and setting said zero insertion force device into said released state when changed from said second position into said first position.

9. The zero insertion force mount according to claim 8, wherein:

said zero insertion force device has an axis of rotation, a conversion device, and reinforcements;

said lever arm has a rotation about said axis of rotation; and said conversion device transforms said rotation of said lever arm about said axis of rotation into a displacement of said reinforcements.

10. The zero insertion force mount according to claim 9, wherein said conversion device has a body with an elliptical cross section disposed along said axis of rotation of said lever arm and is formed of a resilient material.

11. The zero insertion force mount according to claim 9, wherein said conversion device fixes said lever arm in said second position.

12. The zero insertion force mount according to claim 11, wherein said conversion device fixes said lever arm in said second position by using a spring force.

13. The zero insertion force mount according to claim 1, further comprising reinforcements;

in each of said holding devices, a plurality of said front and rear rows of contacts being connected to one another in a mechanically rigid manner by said reinforcements; and in each of said holding devices, said contact elements of at least one of said front and rear rows of contacts being moveable jointly.

14. The zero insertion force mount according to claim 13, wherein, in each of said rows, at least sections of said contact elements of one of said front and said rear rows of contacts are moveable jointly, and said contact elements of said respective other row of contacts are fixed.

15. The zero insertion force mount according to claim 14, further comprising a spring element exerting a force on said fixed contact elements toward said moveable contact elements.

16. The zero insertion force mount according to claim 15, wherein said spring element is formed of a resilient material.

17. The zero insertion force mount according to claim 13, wherein each of said rows of contacts has a plurality of spring elements formed as a common spring element and acting as a unit.

18. The zero insertion force mount according to claim 17, wherein:

each of said rows of contacts has a length;

said contact elements of said contact region have a height; and said common spring element is formed as a body with an elliptical cross section extending entirely over said length of said rows of contacts, is disposed at said height of said contact elements of said contact region on a mounting side facing away from said contact region, and is formed of a resilient material.

19. A zero insertion force mount for fixing and making contact between circuit subassemblies and a substrate, comprising:

a plurality of holding devices each being adapted to hold one of the circuit subassemblies;

a plurality of contact elements each assigned to one of said holding devices and disposed in one of a front row of contacts and a rear row of contacts opposite said front row of contacts on a circuit subassembly disposed against said holding device, said contact elements of a given one of said rows of contacts being connected to one another in a mechanically rigid manner, and said contact elements of at least one of said rows of contacts being moveable jointly, at least in sections; and a zero insertion force device having an axis of rotation, a lever arm rotating about said axis of rotation, a conversion device connected to said lever arm, and reinforcements connected to said conversion device, said lever arm being changeable from a first to a second position to set said zero insertion force device to a stressed state and changeable from said second into said first position to set said zero insertion force device to a released state, said conversion device transforming a rotation of said lever arm about said axis of rotation into a displacement of said reinforcements, said reinforcements, in each case, connecting a plurality of said front and said rear rows of contacts to one another in a mechanically rigid manner, said contact elements in one of said front and said rear rows of contacts being deformable and moveable jointly, and said contact elements of the respective other row of contacts being fixed.

* * * * *